United States Patent
Kim et al.

(10) Patent No.: US 9,832,861 B2
(45) Date of Patent: Nov. 28, 2017

(54) TOUCH PANEL AND MANUFACTURING METHOD THEREOF

(75) Inventors: Byung Soo Kim, Seoul (KR); Keun Sik Lee, Seoul (KR); Chung Won Seo, Seoul (KR); Ji Won Jo, Seoul (KR); Hyuk Jin Hong, Seoul (KR); Yong In Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 52 days.

(21) Appl. No.: 13/501,919

(22) PCT Filed: Oct. 15, 2010

(86) PCT No.: PCT/KR2010/007090
§ 371 (c)(1),
(2), (4) Date: Apr. 13, 2012

(87) PCT Pub. No.: WO2011/046391
PCT Pub. Date: Apr. 21, 2011

(65) Prior Publication Data
US 2012/0206394 A1    Aug. 16, 2012

(30) Foreign Application Priority Data

Oct. 16, 2009 (KR) ........................ 10-2009-0098823

(51) Int. Cl.
*G06F 3/041* (2006.01)
*H05K 1/02* (2006.01)
(Continued)

(52) U.S. Cl.
CPC ........... *H05K 1/0274* (2013.01); *G06F 3/044* (2013.01); *G06F 3/047* (2013.01); *H05K 1/0296* (2013.01);
(Continued)

(58) Field of Classification Search
CPC ........... G06F 2203/04111; G06F 3/044; G06F 3/047; Y10T 29/49155; H05K 1/0274; H05K 1/0296; H05K 1/09
See application file for complete search history.

(56) References Cited

U.S. PATENT DOCUMENTS 5,062,916 A * 11/1991 Aufderheide et al. ........ 156/269
7,263,677 B1 * 8/2007 Teig .................... G06F 17/5068
716/54
(Continued)

FOREIGN PATENT DOCUMENTS

| CN | 10-1131492 A | 2/2008 |
| CN | 101359265 A | 2/2009 |

(Continued)

OTHER PUBLICATIONS

Office Action dated May 21, 2014 in Chinese Application No. 201080057735.8.

(Continued)

*Primary Examiner* — Bryan Earles
(74) *Attorney, Agent, or Firm* — Saliwanchik, Lloyd & Eisenschenk

(57) ABSTRACT

A touch panel is provided. The touch panel includes a substrate, a jumper metal, a first insulation layer, first and second conductive patterns, first and second metal electrodes, and a second insulation layer. The jumper metal is formed on the substrate. The first insulation layer includes an opening and is formed on the jumper metal. The first and second conductive patterns are formed on the first insulation layer. The first and second metal electrodes are respectively connected to end portions of the first and second conductive patterns. The second insulation layer is formed on the first and second conductive patterns and the first and second metal electrodes. One of the first and second conductive (Continued)

patterns is connected by the jumper metal exposed through the opening of the first insulation layer.

23 Claims, 4 Drawing Sheets

(51) Int. Cl.
  *G06F 3/044* (2006.01)
  *G06F 3/047* (2006.01)
  *H05K 1/09* (2006.01)
(52) U.S. Cl.
  CPC ...... *H05K 1/09* (2013.01); *G06F 2203/04111* (2013.01); *Y10T 29/49155* (2015.01)

(56) References Cited

U.S. PATENT DOCUMENTS

| | | | |
|---|---|---|---|
| 8,217,902 | B2 | 7/2012 | Chang et al. |
| 8,274,486 | B2 | 9/2012 | Barbier et al. |
| 8,587,558 | B2 | 11/2013 | Yin et al. |
| 2003/0052867 | A1* | 3/2003 | Shigetaka et al. ............ 345/173 |
| 2003/0218250 | A1 | 11/2003 | Kung et al. |
| 2006/0202970 | A1 | 9/2006 | Lii et al. |
| 2007/0229468 | A1* | 10/2007 | Peng ................... G06F 3/044 345/173 |
| 2008/0142352 | A1* | 6/2008 | Wright ................. G06F 3/044 200/600 |
| 2008/0259044 | A1 | 10/2008 | Utsunomiya et al. |
| 2008/0264699 | A1* | 10/2008 | Chang ................... G06F 3/044 178/18.01 |
| 2009/0002338 | A1 | 1/2009 | Kinoshita et al. |
| 2009/0085885 | A1* | 4/2009 | Wu et al. ................... 345/173 |
| 2009/0160824 | A1 | 6/2009 | Chih-Yung et al. |
| 2009/0236151 | A1 | 9/2009 | Yeh et al. |
| 2009/0244021 | A1 | 10/2009 | Matsuo et al. |
| 2009/0279720 | A1 | 11/2009 | Kim et al. |
| 2010/0026661 | A1 | 2/2010 | Teramoto |
| 2010/0045613 | A1* | 2/2010 | Wu et al. .................... 345/173 |
| 2010/0066700 | A1* | 3/2010 | Mozdzyn .............. G06F 3/044 345/174 |
| 2010/0156840 | A1 | 6/2010 | Frey et al. |
| 2010/0182250 | A1* | 7/2010 | Kang et al. ................ 345/173 |
| 2012/0132511 | A1 | 5/2012 | Tanaka et al. |

FOREIGN PATENT DOCUMENTS

| | | |
|---|---|---|
| CN | 101419521 A | 4/2009 |
| CN | 101441545 A | 5/2009 |
| CN | 101480066 A | 7/2009 |
| CN | 2012-98221 Y | 8/2009 |
| CN | 101546242 A | 9/2009 |
| JP | 2002-260447 A | 9/2002 |
| JP | 3134925 U | 8/2007 |
| JP | 2007-298732 A | 11/2007 |
| JP | 2008033777 A | 2/2008 |
| JP | 3144563 U | 9/2008 |
| JP | 2008269297 A | 11/2008 |
| JP | 2009053894 A | 3/2009 |
| JP | 2009-230735 A | 10/2009 |
| JP | 2010-277354 A | 12/2010 |
| KR | 10-2005-0069637 A | 7/2005 |
| KR | 10-0818464 B1 | 4/2008 |
| TW | 200915151 | 4/2009 |
| TW | M355426 | 4/2009 |

OTHER PUBLICATIONS

Office Action dated Sep. 26, 2013 in Taiwan Application No. 099135290.
Office Action dated Sep. 8, 2015 in Chinese Application No. 2014-141440.
Office Action dated Aug. 13, 2015 in U.S. Appl., No. 14/470,509.
Office Action dated Aug. 17, 2015 in Chinese Application No. 201080057735.8.
Office Action dated Feb. 16, 2016 dated in Chinese Application No. 201080057735.8.
Office Action dated Feb. 25, 2016 in U.S. Appl. No. 14/470,509.
Office Action dated Oct. 21, 2016 in U.S. Appl. No. 14/470,509.
Notice of Allowance dated Oct. 31, 2011 in Korean Application No. 10-2009-0098823, filed Oct. 16, 2009.
International Search Report in International Application No. PCT/KR2010/007090, filed Oct. 15, 2010.
Office Action dated Jul. 9, 2013 in Japanese Application No. 2012-534119, filed Oct. 15, 2010.
Japanese Office Action dated Jul. 28, 2017 in Japanese Application No. 2014-141440.
Office Action dated Sep. 6, 2017 in U.S. Appl. No. 14/470,509.

* cited by examiner

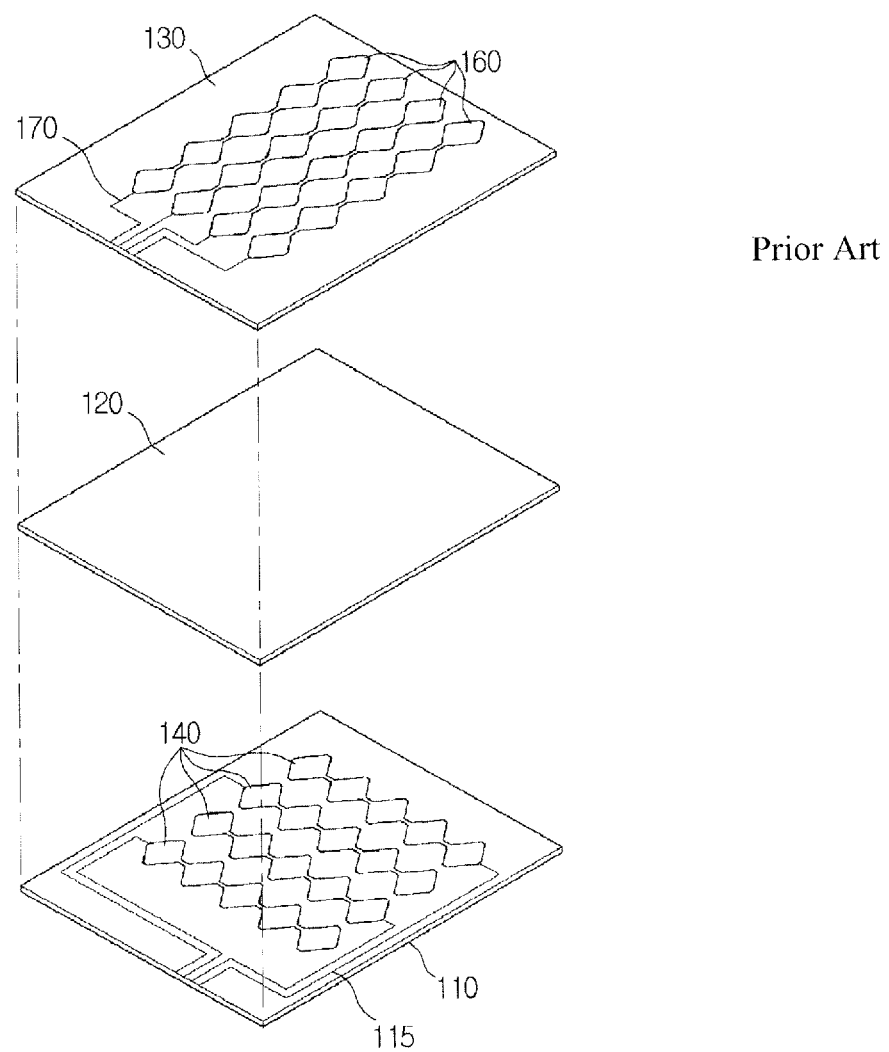
[Fig. 1]
Prior Art

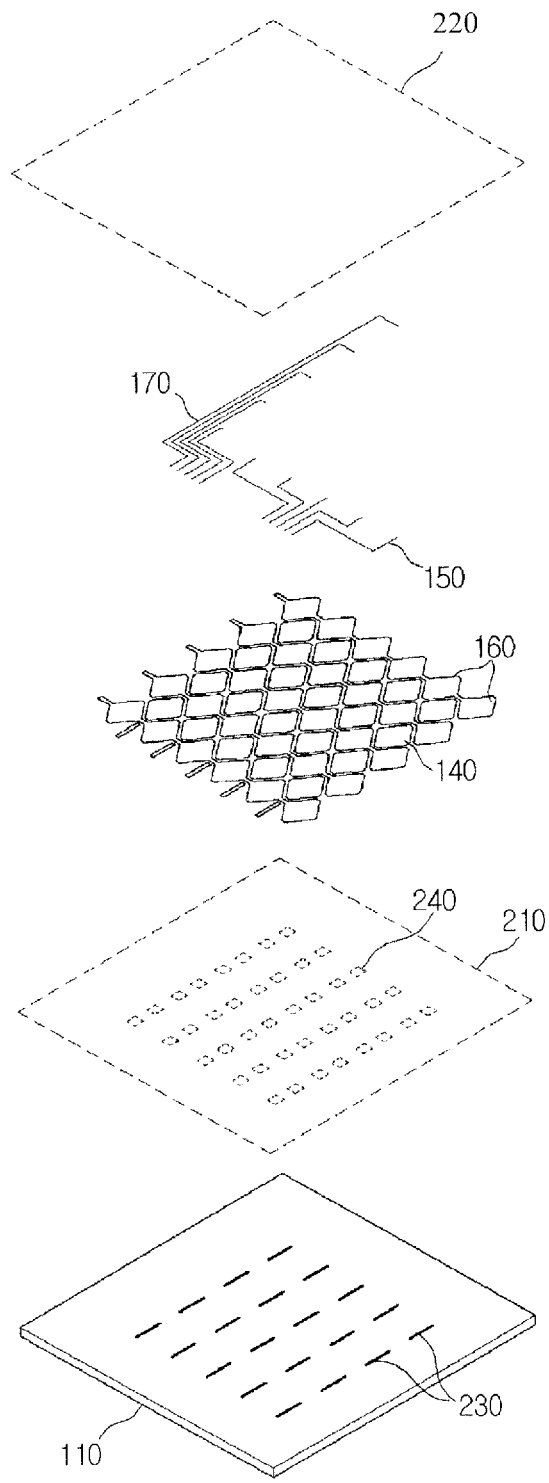

[Fig. 3]
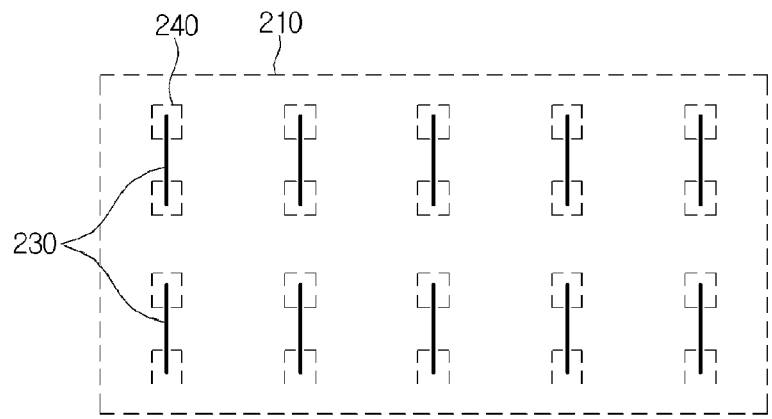
[Fig. 4]
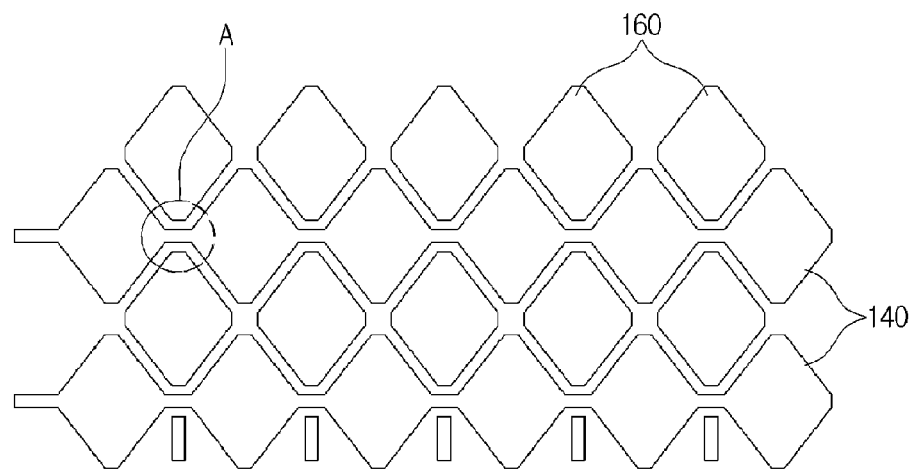
[Fig. 5]
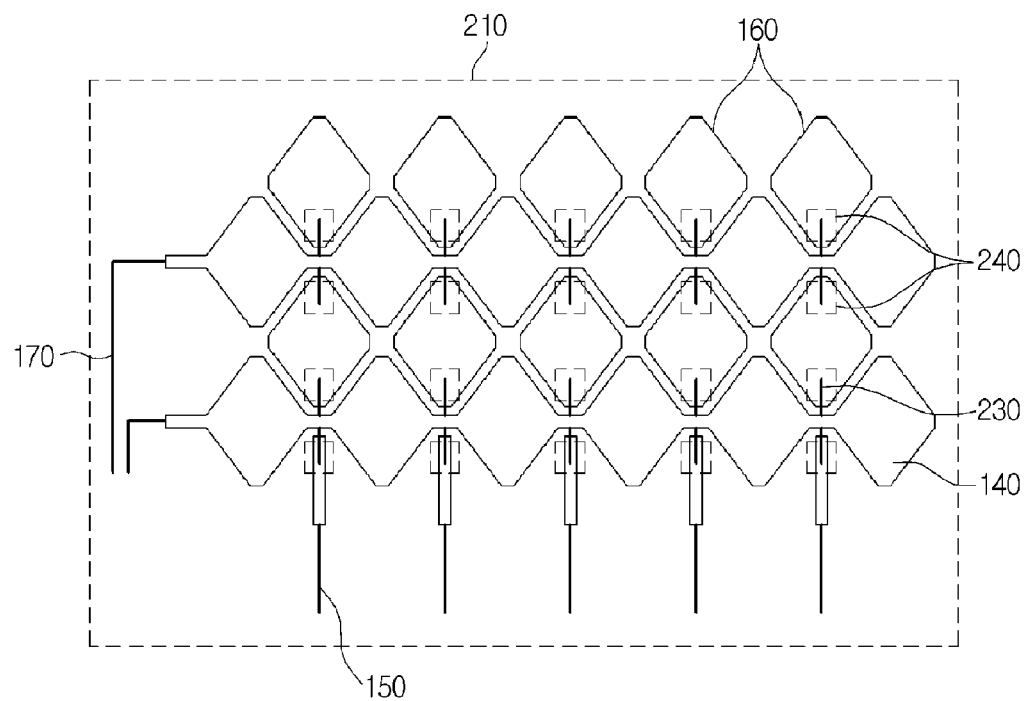

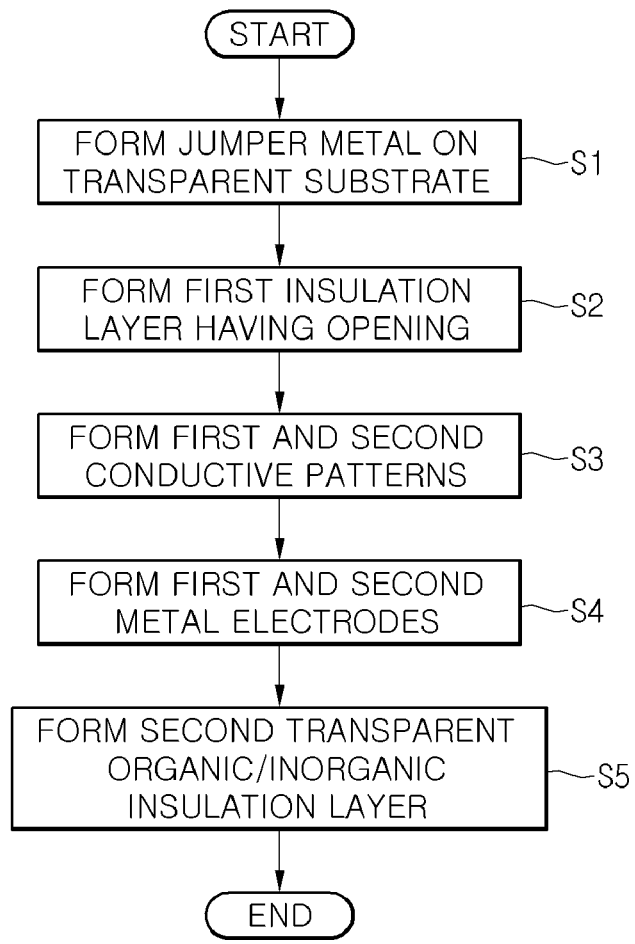
[Fig. 6]

TOUCH PANEL AND MANUFACTURING METHOD THEREOF

CROSS-REFERENCE TO RELATED APPLICATIONS

This application is the U.S. national stage application of International Patent Application No. PCT/KR2010/007090, filed Oct. 15, 2010, which claims priority to Korean Application No. 10-2009-0098823, filed Oct. 16, 2009, the disclosures of each of which are incorporated herein by reference in their entirety.

TECHNICAL FIELD

The present disclosure relates to a touch panel and a manufacturing method thereof.

BACKGROUND ART

In the latest diverse electronic products, a touch panel with an inputting method through which a finger or an input device such as a stylus is used to contact an image displayed on a display device is applied.

The touch panel may be divided into a touch panel of a resistive layer type and a touch panel of an electrostatic capacity type. In the touch panel of a resistive layer type, a position is detected when an electrode becomes a short circuit by pressure of an input device. In the touch panel of an electrostatic capacity type, a position is detected when an electrostatic capacity between electrodes is changed by finger contact.

FIG. 1 is a perspective view illustrating a related art capacitive touch panel.

Referring to FIG. 1, a related art capacitive touch panel includes a lower plate 110, a first conductive pattern 140, a first metal electrode 150, an Optically Clear Adhesive (OCA) 120, an upper plate 130, a second conductive pattern 160, and a second metal electrode 170. In more detail, the first conductive pattern 140 is formed on the lower plate 110, and the first metal electrode 150 connected to the first conductive pattern 140 is formed on the lower plate 110. Herein, as illustrated in FIG. 1, a plurality of conductive pattern shapes are connected in one row in the abscissa axis direction and thereby the first conductive pattern 140 is formed. Also, straight-line pattern shapes are spaced apart. Moreover, the second conductive pattern 160 is formed on the upper plate 130, and the second metal electrode 170 connected to the second conductive pattern 160 is formed on the upper plate 130. Herein, the second conductive pattern 160 is vertical to the first conductive pattern 140. Also, the upper plate 130 and the lower plate 110 adhere to each other by the OCA 120.

In the related art touch panel, the first conductive pattern 140 and the first metal electrode 150 are formed on the lower plate 110, and the second conductive pattern 160 and the second metal electrode 170 are formed on the upper plate 130. That is, the first and second conductive patterns 140 and 160 are formed on different layers, and the first and second metal electrodes 150 and 170 are formed on different layers. However, a structure, in which the upper plate 130 and the lower plate 110 are divided and the OCA 120 is used between the upper plate 130 and the lower plate 110, has limitations.

That is, since the residual having viscosity occurs by using the OCA, efficiency of work decreases and the second failure increases. Moreover, transmittance and visibility decrease due to use of the OCA. Furthermore, there is a limitation in reducing the entire thickness of a touch panel.

Moreover, when a conductive transparent layer, particularly, an Indium-Tin Oxide (ITO) film is used, the cost is high and at least two films are required, whereupon there is another limitation in reducing the thickness of the touch panel.

DISCLOSURE OF INVENTION

Technical Problem

Embodiments provide a touch panel and a manufacturing method thereof, which improve the transmittance and visibility of a thin film without using an Optically Clear Adhesive (OCA).

Solution to Problem

In one embodiment, a touch panel includes: a substrate; a jumper metal on the substrate; a first insulation layer including an opening, on the jumper metal; first and second conductive patterns on the first insulation layer; first and second metal electrodes respectively connected to end portions of the first and second conductive patterns; and a second insulation layer on the first and second conductive patterns and the first and second metal electrodes, wherein one of the first and second conductive patterns is connected by the jumper metal exposed through the opening of the first insulation layer.

The jumper metal may include the same material as a material of at least one of the first and second metal electrodes.

The jumper metal may be a conductive transparent metal.

The first and second conductive patterns and the first and second metal electrodes may include the same material.

The first conductive pattern and the first metal electrode may include the same material, and the second conductive pattern and the second metal electrode may include the same material.

Patterns in the other of the first and second conductive patterns may be connected to each other on the first insulation layer.

The first and second metal electrodes may be disposed on the first insulation layer.

The jumper metal may be formed to connect two patterns adjacent to each other in one of the first and second conductive patterns.

The opening of the first insulation layer may be formed to expose both ends of the jumper metal.

The first and second conductive patterns may be connected in a mutually intersecting direction.

In another embodiment, a method of manufacturing touch panel includes: forming a jumper metal on the substrate; forming a first insulation layer including an opening, on the jumper metal; forming first and second conductive patterns and first and second metal electrodes respectively connected to end portions of the first and second conductive patterns on the first insulation layer, wherein one of the first and second conductive patterns is connected by the jumper metal exposed through the opening; and forming a second insulation layer on the first and second conductive patterns and the first and second metal electrodes.

The jumper metal may include the same material as a material of at least one of the first and second metal electrodes.

The jumper metal may be a conductive transparent metal.

The first and second conductive patterns and the first and second metal electrodes may include the same material.

The first conductive pattern and the first metal electrode may include the same material, and the second conductive pattern and the second metal electrode may include the same material.

The jumper metal may be formed to connect two patterns adjacent to each other in one of the first and second conductive patterns.

The opening of the first insulation layer may be formed to expose both ends of the jumper metal.

The details of one or more embodiments are set forth in the accompanying drawings and the description below. Other features will be apparent from the description and drawings, and from the claims.

Advantageous Effects of Invention

According to the present invention, a thickness of a touch panel can decrease and the residual due to an Optically Clear Adhesive (OCA) can be prevented because the OCA is not used. Also, the transmittance and visibility can be improved. In addition, a manufacturing cost can decrease because an expensive ITO film is used by a small amount.

BRIEF DESCRIPTION OF DRAWINGS

FIG. 1 is a perspective view illustrating a related art capacitive touch panel.

FIG. 2 is a perspective view illustrating a touch panel according to an embodiment.

FIG. 3 is a rear view of a touch panel in which a first insulation layer is formed on a jumper metal, according to an embodiment.

FIG. 4 is a magnified top view illustrating an intersected portion of first and second conductive patterns, according to an embodiment.

FIG. 5 is a top view of a touch panel according to an embodiment.

FIG. 6 is a flowchart illustrating a method of manufacturing touch panel according to an embodiment.

BEST MODE FOR CARRYING OUT THE INVENTION

Reference will now be made in detail to the embodiments of the present disclosure, examples of which are illustrated in the accompanying drawings.

In description of embodiments, it will be understood that in a case where a layer (or film), a region, a pattern, or components is referred to as being 'on' or 'under' another substrate, layer (or film), region or patterns, the 'on' and 'under' include all the meanings of 'directly' and 'indirectly'. Moreover, any reference of the 'on' or 'under' of each layer will be described with reference to the accompanying drawings.

In the accompanying drawings, the thickness or size of each layer (or film), region, pattern or structure may be modified for clarity and convenience and thus does not entirely reflect an actual size thereof.

Moreover, in specification, the meanings of the width and length do not define absolute directions but denote relatively vertical directions. For example, a structure in which a width pattern is formed on a length pattern is the same as a structure in which the length pattern is formed on the width pattern when viewed from different perspectives.

Hereinafter, embodiments will be described in detail with reference to the accompanying drawings.

FIG. 2 is a perspective view illustrating a touch panel according to an embodiment.

Referring to FIG. 2, a touch panel according to an embodiment includes a transparent substrate 110, a first conductive pattern 140, a second conductive pattern 160, a first metal electrode 150, a second metal electrode 170, a first insulation layer 210 having an opening 240, a second insulation layer 220, and a jumper metal 230.

In more detail, the jumper metal 230 is formed on the transparent substrate 110. Herein, the jumper metal 230 may be formed of the same material as that of the first metal electrode 150 or the second metal electrode 170 to be formed later. Also, the jumper metal 230 may be formed as a conductive transparent metal.

The first insulation layer 210 having the opening 240 is formed on the jumper metal 230. Herein, the opening 240 is disposed to pass through the both ends of the jumper metal 230 among the first insulation layer 210. Herein, by appropriately selecting an organic material or an inorganic material as the material of the first insulation layer 210, transmittance may be controlled. Particularly, the first insulation layer 210 may be formed as two or more, for controlling transmittance.

FIG. 3 is a rear view of a touch panel in which the first insulation layer is formed on the jumper metal, according to an embodiment.

Referring to FIG. 3, the jumper metal 230 is electrically insulated from a conductive pattern to be formed on the first insulation layer 210, except for the opening 240.

Referring again to FIG. 2, one or more first conductive patterns 140, in which a plurality of conductive transparent patterns are connected in one row with respect to the abscissa axis of the transparent substrate 110, are formed spaced apart on the first insulation layer 210. Herein, the transparent pattern may be Indium Tin Oxide (ITO). Also, as illustrated, the shape of each of the transparent patterns may have corners that are connected in a diamond shape, but it is not limited thereto. As another example, the each transparent pattern may have an appropriate shape such as a triangle or a pentagonal shape, according to a manufacturer's requirements.

Moreover, a plurality of conductive patterns are formed in the spaced portions between the first conductive patterns 140, respectively. The conductive patterns are not connected to each other.

FIG. 4 is a magnified top view illustrating an intersected portion of the first and second conductive patterns 140 and 160, according to an embodiment.

Referring to FIG. 2 and a portion A of FIG. 4, patterns of the first conductive pattern 140 are connected each other along the abscissa axis on the first insulation layer 210, but the second conductive pattern 160 is not connected along the ordinate axis. Therefore, the jumper metal 230 is used for connecting the second conductive pattern 160. The jumper metal 230 may be formed to connect two patterns adjacent to the second conductive pattern 160.

However, when the jumper metal 230 is used for forming the second conductive pattern 160 connected along the length, electrical connection with the first conductive pattern 140 should be prevented. Therefore, the second conductive pattern 160 is connected by the jumper metal 230 passing through the opening 240, for preventing electrical connection with the first insulation layer 210.

Herein, the first insulation layer 210 may be formed on the jumper metal 230 so as to correspond to the area of the transparent substrate 110, or it may be formed on the jumper metal 230 in order to correspond to an area in which the first and second conductive patterns 140 and 160 will be formed.

Referring again to FIG. 2, the first metal electrode 150 connected to one end of each of the first conductive patterns 140 is formed. Also, the second metal electrode 170 connected to one end of each of the second conductive patterns 160 is formed. Herein, the first metal electrode 150 or the second metal electrode 170 may be formed outside the first insulation layer 210, and the first and second metal electrodes 150 and 170 may be formed on the first insulation layer 210. This depends on how large the area of the first insulation layer 210 is formed to be.

Herein, the first and second conductive patterns 140 and 160 and the first and second metal electrodes 150 and 170 may be formed of the same material.

Moreover, the first and second metal electrodes 140 and 160 are formed of the same material as that of the first and second metal electrodes 150 and 170, respectively.

FIG. 5 is a top view of a touch panel according to an embodiment.

Referring to FIG. 5, the second conductive pattern 160 may be connected by the jumper metal 230 that is formed under the first insulation layer 210. In FIG. 5, although it is illustrated that the second conductive pattern 160 is connected by the jumper metal 230, the first conductive pattern 140 may be connected by the jumper metal 230. This is for that the first and second conductive patterns 140 and 160 will be insulated and be formed on the same plane.

As a result, the touch panel according to an embodiment does not use an Optically Clear Adhesive (OCA), and thus decreases an entire panel thickness and prevents OCA residual from occurring, thereby improving the manufacturing cost and efficiency of the touch panel.

In particular, a conductive transparent layer is formed on the entirety of one surface, a thickness decreases, and particularly, when ITO is used as the conductive transparent layer, the cost can be saved. For example, the existing OCA having a thickness of about 100 and an ITO film having a thickness of about 80 are used, thereby decreasing a thickness of about 180 by about 60% or more.

FIG. 6 is a flowchart illustrating a method of manufacturing touch panel according to an embodiment.

Referring to FIG. 6, a jumper metal is formed on a transparent substrate in operation S1. In more detail, a transparent substrate is prepared. Herein, the transparent substrate may use various transparent materials such as organic and plastic. A metal is formed on the transparent substrate, and a resist corresponding to the shape of the jumper metal is coated. Subsequently, by performing an etching process, the metal of a portion where the resist is not formed is etched, the resist is removed, and thus the jumper metal is formed. Afterward, a first insulation layer having an opening is formed in operation S2. The resist is coated in order for the shape of the first insulating layer to be opened, a first insulator is coated on the opened portion, the resist is removed, and thus the first insulation layer is formed.

Subsequently, first and second conductive patterns are formed on the first insulation layer in operation S3. In more detail, a conductive transparent layer is formed, a resist corresponding to the shape of the first conductive pattern is coated, and a resist corresponding to the shapes of a plurality of patterns that are respectively disposed in the spaced portions of the first conductive pattern and spaced apart is coated. Afterward, by performing an etching process, a conductive transparent layer in a portion where the resist is not formed is etched, and by removing the resist, a plurality of patterns configuring the first and second conductive patterns are formed. Particularly, the second conductive pattern is formed for connecting the both ends of the jumper metal formed in operation S1 through the opening of the first insulation layer.

Then, first and second metal electrodes are formed in operation S4. Herein, the first and second metal electrodes are connected to the first and second conductive patterns, respectively. In more detail, a metal is formed on the first insulation layer (for example, a transparent substrate where the first insulation layer is not formed when the first insulation layer is less than the entire area of the transparent substrate), a resist having a shape corresponding to the first and second metal electrodes is coated, a conductive metal in a portion where the resist is not formed is etched by performing an etching process, and the first and second metal electrodes are formed by removing the resist.

Finally, a second insulation layer is formed on the first and second conductive patterns and the first and second metal electrodes in operation S5.

Herein, operation S3 and operation S4 may be performed at the same time. That is, a metal corresponding to the shapes of the first and second conductive patterns and the shapes of the first and second metal electrodes is formed, a resist is coated, and by removing the resist after etching, the first and second conductive patterns and the first and second metal electrodes may be simultaneously formed of the same material.

Moreover, operation S3 and operation S4 may be performed in combination. That is, the first and second conductive patterns may be simultaneously formed of the same material, and thereafter the first and second metal electrodes may be simultaneously formed of the same material. On the contrary, the first and second metal electrodes may be simultaneously formed of the same material, and thereafter the first and second conductive patterns may be simultaneously formed of the same material.

According to embodiments, the touch panel does not use the OCA, and thus decreases an entire panel thickness and prevents OCA residual from occurring, thereby improving transmittance and visibility. Moreover, the touch panel reduces the use amount of a high-cost ITO film, thereby saving the manufacturing cost.

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A touch panel comprising:
a substrate;
a jumper metal having two outermost ends on a top surface of the substrate;
a first insulation layer comprising an opening, on the jumper metal;
a second insulation layer on the first insulation layer;
a first row extending in a first direction and comprising a plurality of first conductive patterns on the first insulation layer;
a second row extending in a second direction different from the first direction and comprising a plurality of second conductive patterns on the first insulation layer;
a connection part connecting the first conductive patterns;
a first metal electrode connected to an outermost end portion of the first row; and
a second metal electrode connected to an outermost end portion of the second row;
wherein two second conductive patterns of the second row are connected by the jumper metal exposed through the opening of the first insulation layer;
wherein both outermost ends of the jumper metal are exposed through the first insulation layer, such that the outermost ends of the jumper metal do not vertically overlap with the first insulation layer;
wherein a width of the jumper metal, measured in a fourth direction parallel to the top surface of the substrate, is narrower than a width of the opening measured in the fourth direction;
wherein the second insulation layer is disposed on the first metal electrode and the second metal electrode;
wherein a width of the opening is wider than a width of the connection part;
wherein the connection part is not vertically overlapped with the opening;
wherein the jumper metal is vertically overlapped with the opening;
wherein a length of the connection part, measured in the first direction, is shorter than a length of the jumper metal, measured in the second direction;
wherein a length of the jumper metal, measured in the second direction, is smaller than a length of each second conductive pattern, measured in the second direction;
wherein the jumper metal comprises an overlapping area overlapped, in a third direction perpendicular to the first and second directions, with the connection part or a second conductive pattern of the plurality of second conductive patterns;
wherein the jumper metal further comprises a non-overlapping area that is not overlapped, in the third direction, with the connection part or any second conductive pattern;
wherein a length of the non-overlapping area, measured in the second direction, is smaller than a length of the overlapping area, measured in the second direction; and
wherein both the first metal electrode and the second metal electrode are disposed on a different plane from both the first conductive patterns and the second conductive patterns.

2. The touch panel according to claim 1, wherein the jumper metal is a conductive transparent metal.

3. The touch panel according to claim 1, wherein the first and second conductive patterns and the first and second metal electrodes comprise the same material.

4. The touch panel according to claim 1, wherein:
the first conductive pattern and the first metal electrode comprise the same material, and
the second conductive pattern and the second metal electrode comprise the same material.

5. The touch panel according to claim 1, wherein the two second conductive patterns connected by the jumper metal are adjacent to each other.

6. The touch panel according to claim 1, wherein the first direction is perpendicular to the second direction.

7. A method of manufacturing a touch panel, the method comprising:
forming a jumper metal having two outermost ends on a top surface of the substrate;
forming a first insulation layer comprising an opening, on the jumper metal;
forming a first row extending in a first direction and comprising a plurality of first conductive patterns on the first insulation layer;
forming a second row extending in a second direction different from the first direction and comprising a plurality of second conductive patterns on the first insulation layer;
forming a connection part connecting the first conductive patterns;
forming a first metal electrode connected to an outermost end portion of the first row;
forming a second metal electrode connected to an outermost end portion of the second row; and
forming a second insulation layer on the first and second conductive rows and the first and second metal electrodes;
wherein two second conductive patterns of the second row are connected by the jumper metal exposed through the opening of the first insulation layer;
wherein both outermost ends of the jumper metal are exposed by the opening of the first insulation layer, such that the outermost ends of the jumper metal and the first insulation layer do not vertically overlap;
wherein the jumper metal comprises the same material as that of the first and second metal electrodes;
wherein a width of the jumper metal, measured in a fourth direction parallel to the top surface of the substrate, is narrower than a width of the opening measured in the fourth direction;
wherein a bottom surface of the jumper metal is only in direct physical contact with the substrate;
wherein a width of the opening is wider than a width of the connection part;
wherein the connection part is not vertically overlapped with the opening;
wherein the jumper metal is vertically overlapped with the opening;
wherein a length of the connection part, measured in the first direction, is shorter than a length of the jumper metal, measured in the second direction;
wherein a length of the jumper metal, measured in the second direction, is smaller than a length of each second conductive pattern, measured in the second direction;
wherein the jumper metal comprises an overlapping area overlapped, in a third direction perpendicular to the first and second directions, with the connection part or a second conductive pattern of the plurality of second conductive patterns;

wherein the jumper metal further comprises a non-overlapping area that is not overlapped, in the third direction, with the connection part or any second conductive pattern;

wherein a length of the non-overlapping area, measured in the second direction, is smaller than a length of the overlapping area, measured in the second direction; and wherein both the first metal electrode and the second metal electrode are disposed on a different plane from both the first conductive patterns and the second conductive patterns.

8. The method according to claim 7, wherein the jumper metal is a conductive transparent metal.

9. The method according to claim 7, wherein the first and second conductive patterns and the first and second metal electrodes comprise the same material.

10. The method according to claim 7, wherein:
the first conductive pattern and the first metal electrode comprise the same material, and
the second conductive pattern and the second metal electrode comprise the same material.

11. The method according to claim 7, wherein the two second conductive patterns connected by the jumper metal are adjacent to each other.

12. A touch panel comprising:
a substrate;
a jumper metal having two outermost ends on a top surface of the substrate;
a first insulation layer comprising an opening, on the jumper metal;
a second insulation layer on the first insulation layer;
a first row comprising a plurality of first conductive patterns on the first insulation layer;
a second row comprising a plurality of second conductive patterns on the first insulation layer;
a connection part connecting the first conductive patterns;
a first metal electrode connected to an outermost end portion of the first row; and
a second metal electrode connected to an outermost end portion of the second row;
wherein two second conductive patterns of the second row are connected by the jumper metal exposed through the opening of the first insulation layer;
wherein both outermost ends of the jumper metal are exposed through the first insulation layer, such that the outermost ends of the jumper metal do not vertically overlap with the first insulation layer;
wherein a width of the jumper metal, measured in a fourth direction parallel to the top surface of the substrate, is narrower than a width of the opening measured in the fourth direction;
wherein the second insulation layer is disposed on the first metal electrode and the second metal electrode;
wherein a width of the opening is wider than a width of the connection part;
wherein the connection part is not vertically overlapped with the opening;
wherein the jumper metal is vertically overlapped with the opening;
wherein a length of the connection part, measured in the first direction, is shorter than a length of the jumper metal, measured in the second direction;
wherein a length of the jumper metal, measured in the second direction, is smaller than a length of each second conductive pattern, measured in the second direction;

wherein the jumper metal comprises an overlapping area overlapped, in a third direction perpendicular to the first and second directions, with the connection part or a second conductive pattern of the plurality of second conductive patterns;

wherein the jumper metal further comprises a non-overlapping area that is not overlapped, in the third direction, with the connection part or any second conductive pattern;

wherein a length of the non-overlapping area, measured in the second direction, is smaller than a length of the overlapping area, measured in the second direction; and wherein both the first metal electrode and the second metal electrode are disposed on a different plane from both the first conductive patterns and the second conductive patterns.

13. A touch panel comprising:
a substrate;
a jumper metal having two outermost ends on the substrate;
a first insulation layer on the substrate;
a second insulation layer on the first insulation layer;
a first row comprising a plurality of first conductive patterns on the first insulation layer;
a second row comprising a plurality of second conductive patterns on the first insulation layer;
a connection part connecting the first conductive patterns;
a first metal electrode connected to an outermost end portion of the first row; and
a second metal electrode connected to an outermost end portion of the second row;
wherein two second conductive patterns of the second row are connected by the jumper metal;
wherein the second insulation layer is disposed on the first metal electrode and the second metal electrode;
wherein a width of the opening is wider than a width of the connection part;
wherein the connection part is not vertically overlapped with the opening;
wherein the jumper metal is vertically overlapped with the opening;
wherein a length of the connection part, measured in a first direction in which the first row extends, is shorter than a length of the jumper metal, measured in a second direction in which the second row extends;
wherein a length of the jumper metal, measured in the second direction, is smaller than a length of each second conductive pattern, measured in the second direction;
wherein the jumper metal comprises an overlapping area overlapped, in a third direction perpendicular to the first and second directions, with the connection part or a second conductive pattern of the plurality of second conductive patterns;
wherein the jumper metal further comprises a non-overlapping area that is not overlapped, in the third direction, with the connection part or any second conductive pattern;
wherein a length of the non-overlapping area, measured in the second direction, is smaller than a length of the overlapping area, measured in the second direction; and
wherein both the first metal electrode and the second metal electrode are disposed on a different plane from both the first conductive patterns and the second conductive patterns.

14. The touch panel according to claim 1, wherein the jumper metal comprises the same material as that of the first and second metal electrodes.

15. The touch panel according to claim 1, wherein a bottom surface of the jumper metal is only in direct physical contact with the substrate.

16. The touch panel according to claim 12, wherein the jumper metal comprises the same material as that of the first and second metal electrodes.

17. The touch panel according to claim 12, wherein a bottom surface of the jumper metal is only in direct physical contact with the substrate.

18. The touch panel according to claim 13, wherein the jumper metal comprises the same material as that of the first and second metal electrodes.

19. The touch panel according to claim 13, wherein a bottom surface of the jumper metal is only in direct physical contact with the substrate.

20. The touch panel according to claim 1, wherein each second conductive pattern has a lateral surface parallel to a lateral surface of the connection part.

21. The method according to claim 7, wherein each second conductive pattern has a lateral surface parallel to a lateral surface of the connection part.

22. The touch panel according to claim 12, wherein each second conductive pattern has a lateral surface parallel to a lateral surface of the connection part.

23. The touch panel according to claim 13, wherein each second conductive pattern has a lateral surface parallel to a lateral surface of the connection part.

\* \* \* \* \*